United States Patent
Regvar et al.

(10) Patent No.: US 10,141,835 B2
(45) Date of Patent: Nov. 27, 2018

(54) PWM CONTROLLED LOOP WITH ANTI-WINDUP PROTECTION

(71) Applicant: Dialog Semiconductor (UK) Limited, London (GB)

(72) Inventors: Florian Regvar, Graz (AT); Thomas Jackum, Graz-Seiersberg (AT)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/864,109

(22) Filed: Jan. 8, 2018

(65) Prior Publication Data
US 2018/0278147 A1     Sep. 27, 2018

(30) Foreign Application Priority Data
Mar. 27, 2017  (DE) .................. 10 2017 205 127

(51) Int. Cl.
*H02M 3/158* (2006.01)
*H02M 1/32* (2007.01)
(Continued)

(52) U.S. Cl.
CPC .............. *H02M 1/32* (2013.01); *H02M 1/08* (2013.01); *H02M 3/158* (2013.01);
(Continued)

(58) Field of Classification Search
None
See application file for complete search history.

(56) References Cited

U.S. PATENT DOCUMENTS

| | | | |
|---|---|---|---|
| 6,894,910 B1* | 5/2005 | Wu .................. | H02M 1/32 323/268 |
| 2005/0024133 A1* | 2/2005 | Midya .................. | H03F 1/32 330/10 |

(Continued)

FOREIGN PATENT DOCUMENTS

| | | |
|---|---|---|
| CN | 205657593 | 10/2016 |
| CN | 205986624 | 2/2017 |

OTHER PUBLICATIONS

German Office Action, File No. 10 2017 205 127.2, Applicant: Dialog Semiconductor (UK) Limited, dated Jan. 19, 2018, 7 pgs, and English language translation, 11 pgs.

*Primary Examiner* — Jeffrey Gblende
(74) *Attorney, Agent, or Firm* — Saile Ackerman LLC; Stephen B. Ackerman

(57) ABSTRACT

A system to regulate an output voltage based on a reference voltage is described. The system has an error amplifier to determine an error voltage by cumulating a deviation of a feedback voltage from the reference voltage, wherein the feedback voltage is indicative of the output voltage. The system has a PWM unit to generate a PWM control signal based on the error voltage. In addition, the system has a voltage setting unit to set the output voltage based on the PWM control signal. The system has a saturation detection unit to detect a saturation situation of the system. In addition, the system has a clamping means to interrupt a further build-up of the error voltage in the saturated direction while allowing a modification of the error voltage in an opposite direction, opposite to the saturated direction, if a saturation situation is detected.

21 Claims, 5 Drawing Sheets

(51) Int. Cl.
*H02M 1/08* (2006.01)
*H03F 3/45* (2006.01)
*H02M 1/00* (2006.01)

(52) U.S. Cl.
CPC . *H03F 3/45273* (2013.01); *H02M 2001/0025* (2013.01); *H03F 2203/45096* (2013.01)

(56) References Cited

U.S. PATENT DOCUMENTS

| | | | |
|---|---|---|---|
| 2010/0019748 A1* | 1/2010 | Kleine | H02M 3/158 |
| | | | 323/282 |
| 2013/0107587 A1 | 5/2013 | Xu et al. | |
| 2016/0261258 A1* | 9/2016 | van Eeden | H03K 19/21 |
| 2017/0179816 A1 | 6/2017 | Michel | |
| 2017/0194858 A1 | 7/2017 | Villot et al. | |

* cited by examiner

PWM CONTROLLED LOOP WITH ANTI-WINDUP PROTECTION

TECHNICAL FIELD

The present document relates to PWM (pulse width modulation) controlled loops, e.g. PWM controlled loops for controlling the output voltage of a switched mode power supply. In particular, the present document relates to anti-windup protection in PWM controlled loops.

BACKGROUND

PWM controlled loops may be used for controlling the duty cycles of power switches comprised within switched mode power converters, e.g. buck converters. The PWM controlled loop may adapt the pulse width of a PWM control signal based on the deviation of the output voltage at the output of the power converter from a reference or target voltage. In particular, an error voltage may be determined by integrating the deviation of the output voltage from the reference voltage over time. In case of substantial deviations (e.g. subject to a load transient at the output of the power converter), the (integrated or cumulated) error voltage may wind up, thereby delaying the recovery of the PWM controlled loop.

SUMMARY

The present document addresses the technical problem of providing a system with a PWM controlled loop comprising efficient and reliable anti-windup protection. According to an aspect a system configured to regulate an output voltage based on a reference voltage is described. The system comprises a PWM controlled loop. Hence, the output voltage of the system is controlled using a PWM control signal. The PWM control signal typically comprises a sequence of pulses in a corresponding sequence of cycles. The different cycles may be indicated or may be set using a PWM clock. The width or duration of the pulses may be varied to control the system. In particular, the regulation of the output voltage may be performed by adapting the width or duration of the pulses of the PWM control signal.

The system comprises an error amplifier which is configured to determine an error voltage by cumulating the deviation of a feedback voltage from the reference voltage, wherein the feedback voltage is indicative of (e.g. proportional to or equal to) the output voltage. The deviation of the feedback voltage from the reference voltage may be positive or negative. The error amplifier may be such that the error voltage increases, if the deviation is positive, and such that the error voltage decreases, if the deviation is negative. Alternatively, the error amplifier may be such that the error voltage decreases, if the deviation is positive, and such that the error voltage increases, if the deviation is negative. The error voltage may be determined by cumulating the deviation over time. The deviation may be cumulated without resetting the error voltage, i.e. the error voltage may be adapted in a continuous manner during the entire operation of the system. As such, a prolonged deviation having the same sign (i.e. being either positive or negative) may lead to a build up or wind up of the error voltage.

The system further comprises a PWM unit which is configured to generate a PWM control signal based on the error voltage. The PWM control signal may also be determined based on a PWM clock, wherein the PWM clock indicates or defines successive cycles of the PWM control signal. In particular, the PWM unit may comprise a comparator which is configured to compare the error voltage with a saw wave voltage to generate the PWM control signal. The saw wave voltage may ramp up repeatedly in the sequence of cycles set by the PWM clock. Hence, within a cycle, there may be a time instant, when the saw wave voltage becomes equal to or greater than the error voltage, thereby triggering the beginning or the end of a pulse of the PWM control signal.

In addition, the system comprises a voltage setting unit which is configured to set the output voltage based on the PWM control signal. The voltage setting unit may comprise a power switch (e.g. a metal oxide semiconductor, MOS, field effect transistor, FET) which is configured to couple the output voltage to an input voltage (e.g. to a power supply) of the system, wherein a duty cycle of the power switch depends on the PWM control signal (e.g. on the duration of width of the pulses of the PWM control signal). In particular, the voltage setting unit may comprise a switched mode power converter (e.g. a DC/DC power converter such as a buck and/or boost converter) which is controlled using the PWM control signal.

Furthermore, the system comprises a saturation detection unit which is configured to detect a saturation situation of the system. A saturation situation may be a situation during which the error voltage is built up (or wound up) in a saturated direction without impacting the PWM control signal. By way of example, a saturation situation may be such that the error voltage increases, without increasing (or reducing) the duration of the pulses of the PWM control signal. Alternatively, a saturation situation may be such that the error voltage decreases, without decreasing (or increasing) the duration of the pulses of the PWM control signal. As such, the saturation situation may be such that the PWM controlled loop is saturated in a particular saturated direction, wherein the saturated direction may be the direction of a further increase of the error voltage or the direction of a further decrease of the error voltage.

The system further comprises clamping means which are configured to interrupt a further build-up of the error voltage in the saturated direction (i.e. a further increase or a further decrease of the error voltage) while allowing a modification of the error voltage in an opposite direction (i.e. allowing a decrease or an increase of the error voltage), opposite to the saturated direction, if a saturation situation is detected.

Hence, a system with a PWM controlled loop is provided, which provides efficient and reliable means for preventing the error voltage of the PWM controlled loop to wind-up, thereby increasing the stability and reactivity of the system subject to transients (e.g. subject to load transients).

The saturation detection unit may be configured to detect a saturation situation based on the PWM control signal, thereby enabling a particularly efficient detection of a saturation situation. By way of example, the saturation detection unit may be configured to determine a duration or width of a pulse of the PWM control signal within a cycle of the PWM control signal. Furthermore, the duration or width of the pulse may be compared with the duration or width of the cycle. By way of example, it may be determined that the pulse takes up more than 95% (99%) or less than 5% (1%) of the duration or width of a cycle. A saturation situation may then be determined based on the comparison (e.g. if the pulse takes up more than 95% (99%) or less than 5% (1%) of the duration or width of a cycle).

As indicated above, the PWM control signal may be used within the system to turn on or turn off a power switch of the voltage setting unit. The saturation detection unit may be configured to determine whether an on-time duration or an off-time duration of the power switch is at or below a pre-determined minimum duration, to detect a saturation situation. Hence, saturation situations may be detected in an efficient and reliable manner.

The saturation detection unit may be configured to determine a saturation signal indicating whether a saturation situation has been detected. The saturation signal may be a digital signal having a first level to indicate that a saturation situation has been detected and having a second level to indicate that no saturation situation has been detected. In particular, a first saturation signal may be generated to indicate a saturation situation in a first saturation direction (e.g. an increase of the error voltage). Furthermore, a second saturation signal may be generated to indicate a saturation situation in a second saturation direction which is opposite to the first saturation direction (e.g. a decrease of the error voltage).

The clamping means (e.g. one or more switches of the clamping means) may then be controlled based on the one or more (digital) saturation signals, thereby providing for an efficient and reliable control of the clamping means.

The error amplifier may comprise an electrical storage unit configured to store an electrical charge (e.g. an electrical current). The storage unit may comprise or may be a capacitor. The error voltage may increase as the amount of the electrical charge stored within the electrical storage unit increases. Furthermore, the error voltage may decrease as the amount of the electrical charge stored within the electrical storage unit decreases.

The clamping means may comprise a first switch (e.g. a transistor) which is configured to stop electrical charge (or electrical current) from being charged to the storage unit and/or a second switch (e.g. a transistor) which is configured to stop electrical charge from being discharged from the storage unit. The first switch may be used to interrupt a further increase of the error voltage and the second switch may be used to interrupt a further decrease of the error voltage. Hence, clamping of the error voltage may be performed in an efficient manner.

The error amplifier may comprise an input stage which is configured to provide electrical charge (e.g. an electrical current) to the storage unit or draw electrical charge (e.g. an electrical current) from the storage unit depending on the sign (positive or negative) of the deviation of the feedback voltage from the reference voltage. The first switch and/or second switch may then be configured to couple or to decouple the input stage to or from the storage unit.

In particular, the clamping means may be configured to control the first switch to stop electrical charge (e.g. electrical current) from being charged to the storage unit and to control the second switch for enabling electrical charge (e.g. electrical current) to be discharged from the storage unit, if the saturation direction corresponds to an increase of the error voltage. Furthermore, the clamping means may be configured to control the first switch to enable electrical charge (e.g. an electrical current) to be charged to the storage unit and to control the second switch for stopping electrical charge (e.g. an electrical current) from being discharged from the storage unit, if the saturation direction corresponds to a decrease of the error voltage. By doing this, clamping of the error voltage may be achieved in an efficient and precise manner, while at the same time maintaining the PWM controlled loop in the non-saturated direction.

The error amplifier may be configured to provide or to draw a quiescent electrical charge (notably a quiescent current). The clamping means may be configured to compensate for the quiescent electrical charge drawn by the error amplifier, if the first switch stops electrical charge from being charged to the storage unit. Alternatively or in addition, the clamping means may be configured to compensate for the quiescent electrical charge provided by the error amplifier, if the second switch stops electrical energy from being discharged from the storage unit. By doing this, a stable saturation detection is enabled. In particular, a progressive modification of the error voltage in the non-saturated direction caused by the quiescent electrical charge may be avoided, wherein such progressive modification may cause the saturation detection unit to detect the end of a saturation situation in an intermittent manner.

According to a further aspect, a method for setting an output voltage is described. The method comprises determining an error voltage by cumulating a deviation of a feedback voltage from a reference voltage, wherein the feedback voltage is indicative of the output voltage. Furthermore, the method comprises generating a PWM control signal based on the error voltage. In addition, the method comprises setting the output voltage based on the PWM control signal. Furthermore, the method comprises detecting a saturation situation of the system during which the error voltage is built up in a saturated direction without impacting the PWM control signal. The method further comprises interrupting a build-up of the error voltage in the saturated direction while allowing a modification of the error voltage in an opposite direction, opposite to the saturated direction, if a saturation situation is detected.

It should be noted that the methods and systems including its preferred embodiments as outlined in the present document may be used stand-alone or in combination with the other methods and systems disclosed in this document. Furthermore, all aspects of the methods and systems outlined in the present document may be arbitrarily combined. In particular, the features of the claims may be combined with one another in an arbitrary manner.

BRIEF DESCRIPTION OF THE DRAWINGS

The invention is explained below in an exemplary manner with reference to the accompanying drawings, wherein.

DESCRIPTION

Figure 1:
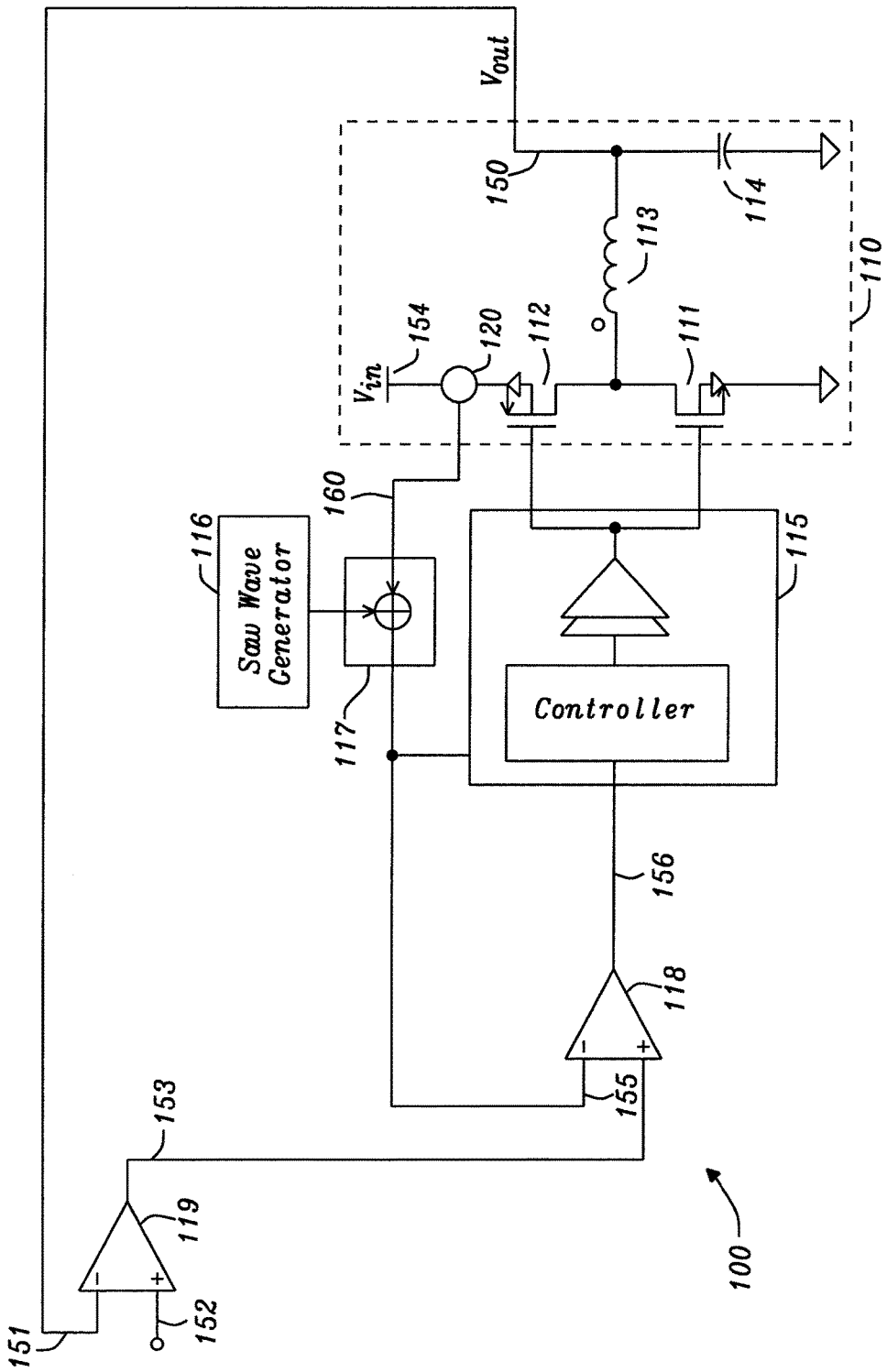
FIG. 1 illustrates a circuit diagram of an example DC-to-DC converter with a PWM controlled loop.

As indicated above, the present document is directed at the technical problem of providing efficient and reliable anti-windup protection for a PWM controlled loop. In this context, FIG. 1 shows a system 100 comprising a buck converter 110, wherein the system 100 comprises a PWM controlled loop for setting the switching times of the switches 111, 112 of the buck converter 110. It should be noted that even though the following aspects are described in the context of a buck converter 110, the aspects are also applicable to other DC-to-DC converters, e.g. to other DC-to-DC step-down converters or DC-to-DC step-up converters, and to other systems 100 comprising PWM controlled loops.

The buck converter 110 comprises a high side switch 112 (e.g. a PMOS transistor) and a low side switch 111 (e.g. a NMOS transistor), as well as a buck inductor 113 and a buck capacitor 114. The duty cycle of the buck converter 110 (i.e. the duty cycle of the high side switch 112) is controlled via a feedback voltage $V_{fb}$ 151 which is equal to (or proportional to) the output voltage $V_{out}$ 150. The feedback voltage 151 may be derived from the output voltage 150 using a voltage divider (not shown in FIG. 1). The feedback voltage $V_{fb}$ 151 is compared to a reference voltage $V_{ref}$ 152 using e.g. an error amplifier 119, thereby providing a (cumulated or integrated) error voltage $V_{error}$ 153. In stable operation, when the output voltage $V_{out}$ 150 corresponds to the desired output voltage of the system 100, the error voltage $V_{error}$ 153 should approximate zero or should take on a pre-determined default error value which may be tuned using the reference voltage $V_{ref}$ 152. However, in case of load transients, the output voltage $V_{out}$ 150 may dip or peak, thereby causing the error voltage $V_{error}$ 153 to take on absolute values greater than zero or low than zero.

Overall, the error voltage $V_{error}$ 153 may be used to regulate the output voltage $V_{out}$ 150 which is provided by the system 100. The regulation of the output voltage $V_{out}$ 150 may be achieved by controlling the duty cycle of the high side switch 112. This duty cycle may be controlled using the error voltage $V_{error}$ 153. For example, the error voltage $V_{error}$ 153 may be compared with a saw wave voltage 155 having a pre-determined cycle length. The cycle length typically corresponds to the length of the commutation cycle of the buck converter 110 (i.e. the combined length of an on-state and a succeeding off-state of the high side switch 112). The saw wave voltage 155 typically has a maximum voltage $V_{saw}$ at the peak of each saw tooth. The saw wave voltage 155 is compared to the error voltage $V_{error}$ 153 using comparator 118 (e.g. a hysteretic comparator), thereby generating a pulse width modulated (PWM) control signal 156 which is negative (or zero) when the saw wave voltage 155 is greater than $V_{error}$ 153, and positive when the saw wave voltage 155 is smaller than $V_{error}$ 153. The transition from negative to positive may be taken as a trigger for the duty cycle. In particular, the PWM (pulse width modulated) control signal 156 generated by the comparator 118 may be used by the buck control unit 115 to generate the drive signals for the high side switch 112 and the low side switch 111 of the buck converter 110. The regulator may be tuned by selecting the maximum voltage $V_{saw}$ of the saw wave voltage 155 and the reference voltage $V_{ref}$ 152 based on the input voltage $V_{in}$ 154 and the desired output voltage 150.

The regulation of the duty cycle of the buck converter 110 can be enhanced by also taking into account the inductor current, i.e. the current through the inductor 113 of the buck converter 110. For this purpose, the system 100 may comprise current sensing means 120 for sensing the current through the high side switch 112 (which corresponds to the inductor current when the high side switch 112 is in on-state). The current sensing means 120 may e.g. be implemented as a current mirror, which mirrors and possibly amplifies the current through the high side switch 112. The sensed current $I_{sns}$ 160 provided by the current sensing means 120 is therefore typically proportional (or equal) to the current through the high side switch 112 (and to the current through the inductor 113, when the high side switch is in its on-state). At 100% duty cycle of the buck converter 110 and in stable operation, the current through the high side switch 112 is typically constant and corresponds to the input voltage $V_{in}$ 154 divided by the impedance of the load of the system 100.

The sensed current Isns 160 may be added in addition unit 117 to a saw wave signal having the cycle length of the buck converter 110. The adding unit 117 further converts the sum of the saw wave signal and the sensed current $I_{sns}$ 160 into the saw wave voltage $V_{isns}$ 155. The saw wave signal may be generated by a saw wave generator 116 (comprising e.g. a switch (e.g. a transistor) in parallel to a capacitor). Overall, the saw wave generator 116 and the adding unit 117 provide the saw wave voltage $V_{isns}$ 155 which comprises a periodic saw wave signal (generated by the saw wave generator 116) that is offset by a voltage derived from the sensed current $I_{sns}$ 160. As indicated above, $I_{sns}$ 160 is a constant current in case of stable operation of the buck converter 110 at 100% duty cycle. In such cases, the saw wave voltage $V_{isns}$ 155 corresponds to the periodic saw wave signal offset by a constant voltage derived from the constant current $I_{sns}$ 160. In case of a duty cycle lower than 100%, the sense current $I_{sns}$ is zero when the high side switch 112 is in off-state and has a saw like rising shape when the high side switch 112 is in on-state. The saw like rising shape of the sense current $I_{sns}$ 160 during the on-state of the high side switch 112 results from the current throttling properties of the inductor 113. Hence, in cases of a duty cycle of less than 100%, the saw wave voltage $V_{isns}$ 155 is obtained as an overlay of the periodic saw wave signal and an intermittent saw shaped voltage derived from the sensed current $I_{sns}$ 160.

In the system 100 of FIG. 1, the saw wave voltage $V_{isns}$ 155 is compared to the error voltage $V_{error}$ 153 to generate the pulse width modulated (PWM) control signal 156 towards the driver and controller 115 of the buck converter 110. In case of a load transient (e.g. a sudden increase of the load current), the sensed current $I_{sns}$ 160 increases, thereby increasing the slope of the saw wave voltage $V_{isns}$ 155. At the same time, the output voltage $V_{out}$ 150 may drop, leading to an increase of the error voltage $V_{error}$ 153. Both effects tend to move forward the trigger point for the pulse width modulated signal 156, thereby increasing the duty cycle of the buck converter 110 and thereby compensating the effect of the load transient.

The error amplifier 119 is typically configured to cumulate the deviation between the feedback voltage 151 and the reference voltage 152 over time. During stable operation, the deviations tend to oscillate around zero, thereby providing an error voltage 153 which is substantially constant such that the PWM control signal 156 remains substantially unchanged. Subject to a load transient the output voltage 150 may drop, leading to a substantial (positive) deviation of the feedback voltage 151 from the reference voltage 152. As a result of this, the error amplifier 119 builds up the error voltage 153, thereby moving forward the trigger point for the PWM control signal 156, eventually leading to a 100% duty cycle. If the (positive) deviation continues over an extended time period, the error voltage 153 continues to build up, even though the PWM control signal 156 is already at a 100% duty cycle. Hence, the error voltage 153 winds up beyond a voltage value needed for regulation of the PWM controlled loop.

At the end of the load transient, the (positive) deviation ends. However, due to the fact that the error voltage 153 has been wound up to a relatively high voltage value, the PWM control signal 156 continues to operate the buck converter 110 at a 100% duty cycle, which will typically lead to an increasing output voltage 150 and by consequence to a negative deviation of the reference voltage 152 from the feedback voltage 151. Due to this negative deviation, the error voltage 153 is progressively reduced, eventually reducing the duty cycle and eventually leading the buck converter 110 to stable operation. However, the progressive reduction of the error voltage 153 subject to a wind-up situation typically takes time, thereby reducing the transient performance of the system 100.

In order to increase the transient performance of a system 100 comprising a PWM controlled loop, the system 100 may comprise means for detecting a saturation of the PWM controlled loop. In particular, a high level or upper saturation may be detected (e.g. by detecting that the PWM control signal 156 of the PWM controlled loop is at or near 100%) or a low level or lower saturation may be detected (e.g. by detecting that the PWM control signal 156 is at or near 0%). In response to detecting a saturation, the error voltage 153 of the PWM controlled loop may be clamped to avoid wind-up of the error voltage 153. By doing this, recovery subject to a load transient may be accelerated.

By way of example, the high side switch 112 of the buck converter 112 may be turned on with the rising edge of the PWM control signal 156 and turned off with the falling edge of the PWM control signal 156. The saturation detection may be implemented for upper and lower level saturation. Upper level saturation occurs for an error voltage 153 that corresponds to the maximal possible duty cycle (e.g. 100%). On the other hand, lower level saturation corresponds to the minimum possible duty cycle (e.g. 0%).

By observing the output of the PWM comparator 118 (i.e. by analyzing the PWM control signal 156), it is possible to detect saturation. Upper level saturation may be detected, if the PWM comparator 118 is not triggering within one PWM clock period. On the other hand, lower level saturation may be detected, if the PWM comparator 118 is already triggering before the high side switch 112 is fully turned on. Upper and lower limits for detecting saturation may also be defined by using an artificial minimum on time and/or an artificial minimum off time of the high side switch 112. In other words, the PWM control signal 156 may be evaluated. If the pulse width of the PWM control signal 156 is such that the duration between successive pulses or the duration of a pulse is below a pre-determined minimum duration, saturation of the PWM controlled loop may be detected.

Figure 4:
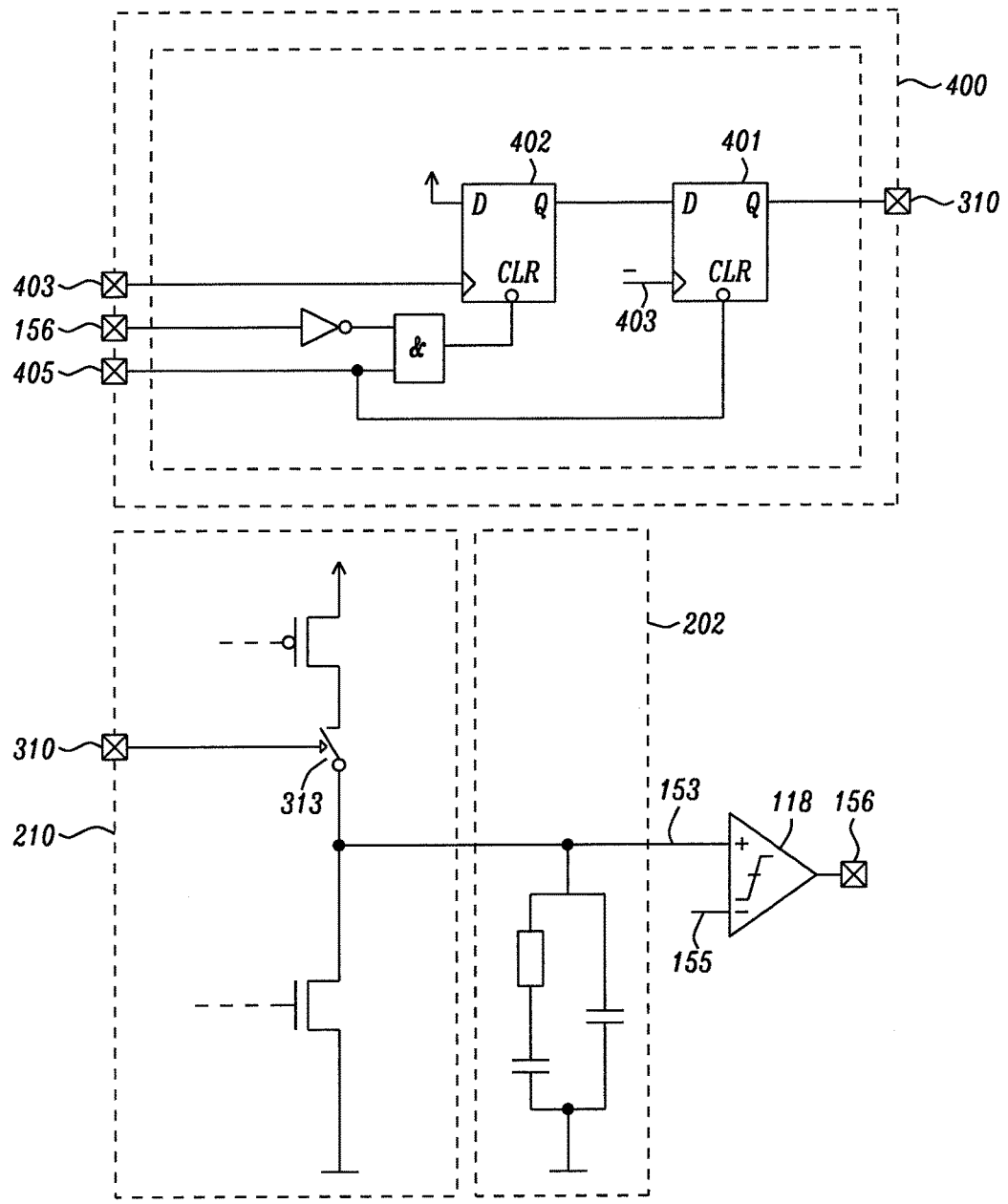
FIG. 4 shows an example error amplifier with upper clamping means.

FIG. 4 shows an example detection circuit 400 for detecting an upper level saturation situation. Such a detection circuit 400 may be added to the control logic of the system 100. The logic components 401, 402 are configured to generate an upper level saturation signal 310 which is high, when upper level saturation is detected, and which is low, when no upper level saturation is detected. The upper level saturation detection is performed based on the PWM control signal 156. Furthermore, the PWM clock 403 and an Enabling-Signal 405 may be taken into account. Low level saturation detection may be provided in an analogous manner.

Figure 2:
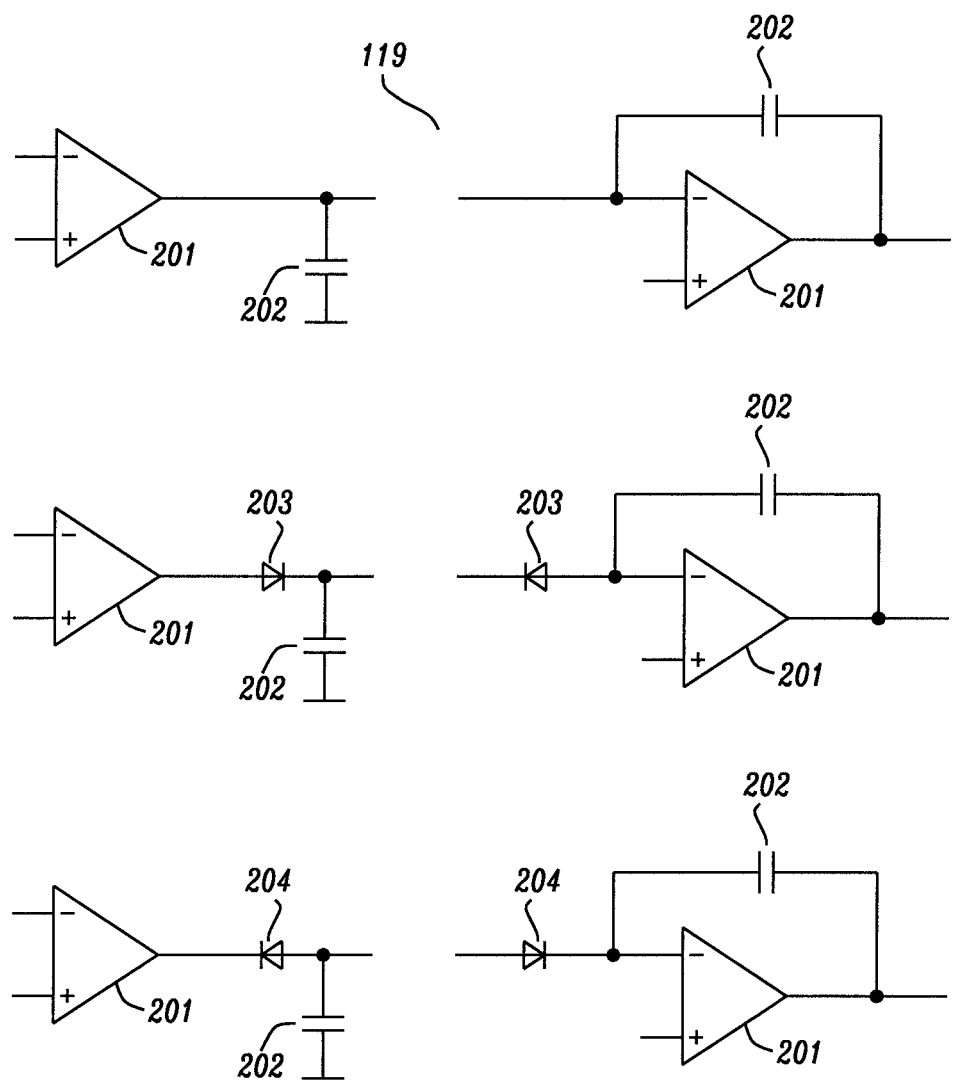
FIG. 2 illustrates the principle of clamping of an error amplifier.

When a saturation situation has been detected, the error voltage 153 may be clamped. This may be achieved by disabling the error amplifier 119 to further integrate the deviation at the input of the error amplifier 119 in the saturated direction. FIG. 2 illustrates on the top row two different architectures for an error amplifier 119, notably a forward architecture (on the left side) and a feedback architecture (on the right side). The error amplifier 119 comprises an amplifier 201 (e.g. comprising an operational amplifier or transconductance amplifier) and an integrating capacitor 202 (referred to as a storage unit).

Disabling the error amplifier 119 to further integrate the deviation provided by the comparator or amplifier 201 may be achieved by disabling current flowing through the integrating capacitor 202 in the saturated direction. The middle row of FIG. 2 shows the use of diodes 203 for blocking the current in case of a low level saturation situation, and the bottom row of FIG. 2 shows the use of diodes 204 for blocking the current in case of a high level saturation situation. It should be noted that the diodes 203, 204 are only used for illustrative purposes, in order to illustrate that further integration of the deviation in the saturated direction is interrupted, once saturation has been detected. On the other hand, integration of the deviation in the non-saturated direction is still maintained, thereby maintaining the loop, even during a saturation situation.

Figure 3:
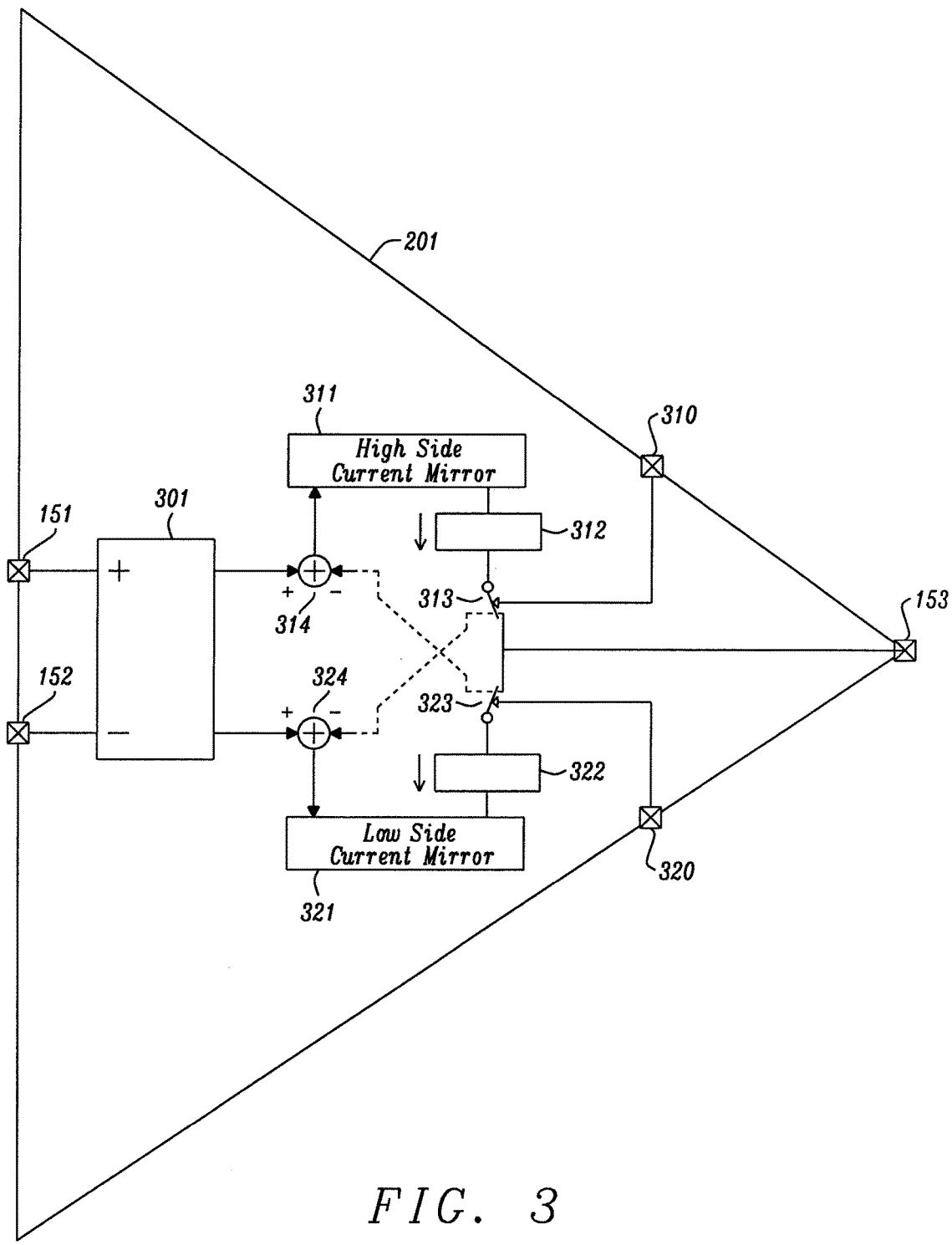
FIG. 3 shows an example error amplifier with clamping means.

FIG. 3 shows an example amplifier or comparator 201 of an error amplifier 119 which comprises clamping means for clamping the error voltage 153 in case of saturation of the PWM controlled loop. The amplifier 201 is controlled based on a saturation signal 310, 320 which indicates whether the PWM controlled loop is saturated. In particular, the high level saturation signal 310 may indicate that the PWM controlled loop exhibits a high level saturation and the low level saturation signal 320 may indicated that the PWM controlled loop exhibits a low level saturation.

The amplifier 201 comprises an input stage 301 which is configured to provide a current (in case of a positive deviation at the input of the amplifier 201) and to sink a current (in case of a negative deviation at the input of the amplifier 201). Using a current mirror 311, 321, the current at the output of the input stage 301 may be copied (and/or amplified) to the output of the amplifier 201. The amplifier 201 comprises a high level clamping switch 313 which is controlled using the high level saturation signal 310. If the high level saturation signal 310 indicates a saturation situation, the high level clamping switch 313 may be opened to interrupt the current provided by the input stage 301, thereby interrupting the charging of the capacitor 202 and thereby preventing a wind-up of the error voltage 153. On the other hand, the low level clamping switch 323 remains closed, thereby enabling the discharging of the capacitor 202 and thereby enabling the reduction of the error voltage 153.

If the low level saturation signal 320 indicates a low level saturation situation, the low level clamping switch 323 may be opened to interrupt current to be discharged from the capacitor 202. Hence, a wind-up of the error voltage 153 in the negative direction may be prevented. On the other hand, the high level clamping switch 313 may remain closed, thereby enabling an increase of the error voltage 153 subject to a low level saturation situation.

The amplifier 201 may exhibit a quiescent current that is provided at the output of the amplifier 201 even if the feedback voltage 151 and the reference voltage 152 are equal. The quiescent current may be compensated by feeding back the current providing at the output of one current mirror 321 to the input of the other current mirror 311 (or vice versa) using the adding units 314, 324. By doing this, clamping may be improved.

Hence, an implementation example for an error amplifier with a forward architecture is shown in FIG. 3. The high side current mirror 311 may be implemented as a current source and the low side current mirror 321 may be implemented as a current sink.

This is formally illustrated by the boxes 312, 322. It should be noted, however, that a current mirror typically provides such property inherently.

In case the error amplifier 119, 201 has a class B or AB output, the optional part depicted by the dotted lines may not be needed. It should be noted that the clamping or the limitation of the integration current shown in FIG. 3 is only an example and that other means for clamping or limiting the integration current may be used.

FIG. 4 shows a transistor level implementation of a part of the error amplifier 119, 201 of FIG. 3. In particular, the high level clamping switch 313 is shown, which enable or disables an integration current for charging the capacitor 202. The circuit of FIG. 4 does not comprise means for compensating the quiescent current. This means that the output current may not be clamped to zero, but that a current in the non-saturated direction may be drawn. This may generate an erroneous information to a saturation detection unit 400 of leaving a saturation situation. The saturation detection unit 400 may therefore stop clamping for a certain time interval until saturation is detected again. Therefore, a certain pulse pattern may be observed on the error voltage 153, when not performing compensation of the quiescent current (see FIG. 5).

Figure 5:
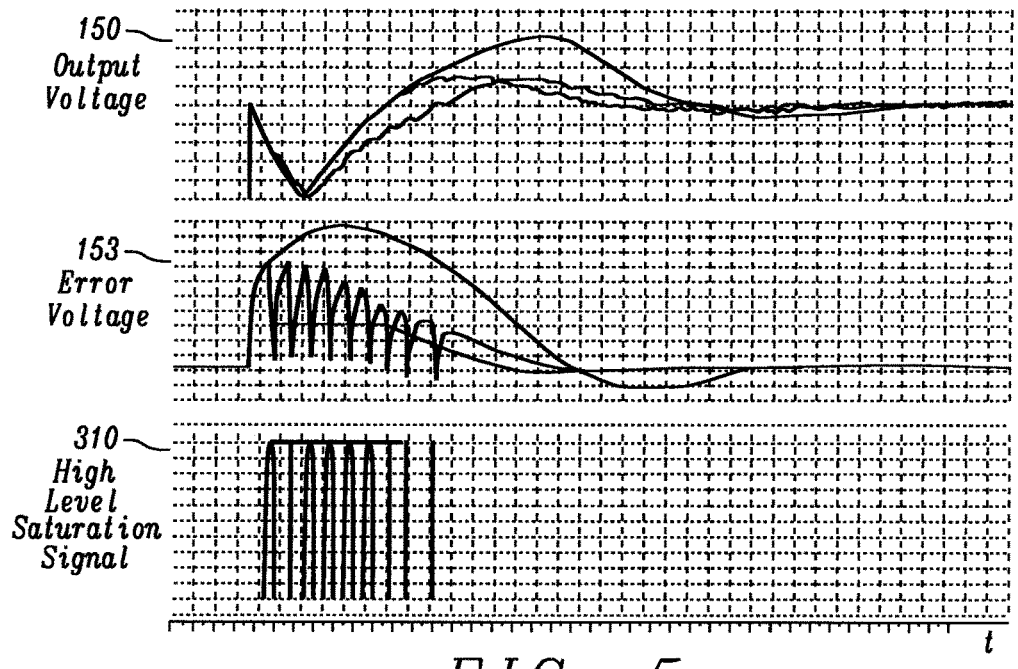
FIG. 5 shows example measurement signals of a PWM controlled loop.

FIG. 5 shows the output voltage 150, the error voltage 153 and the high level saturation signal 310 subject to a load transient for three different cases, notably for a first case without clamping, for a second case with clamping (without quiescent current compensation) and for a third case with clamping (with quiescent current compensation). It can be seen from FIG. 5 that using clamping, the recovery of the output voltage 150 subject to a load transient may be accelerated. Furthermore, an overshoot of the output voltage 150 may be reduced. It can be seen that these improvements are obtained due to the clamping of the error voltage 153. As described above, the simple clamping implementation (without quiescent current compensation) generates a pulsed pattern on the error voltage 153 due to a distraction of the saturation detecting unit 400. Nevertheless, the controlled output voltage 150 settles in a smooth and rapid manner.

Figure 6:
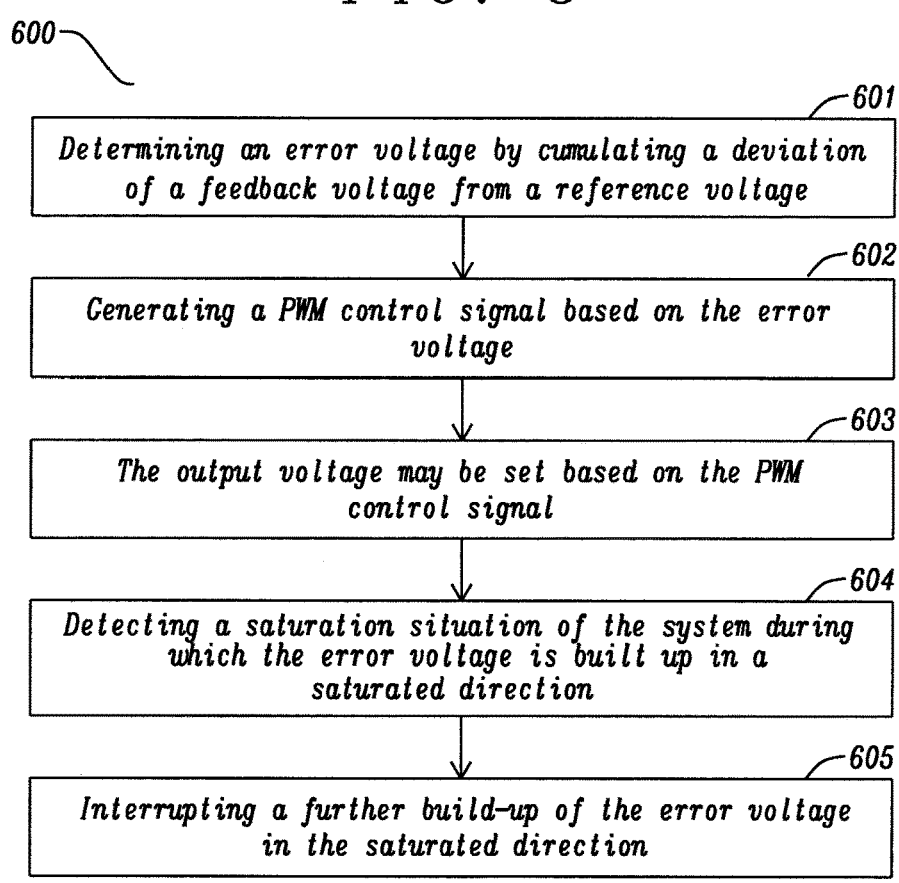
FIG. 6 shows a flow chart of an example method for protecting a PWM controlled loop.

FIG. 6 shows a flow chart of an example method 600 for setting, notably for regulating, an output voltage 150. The method 600 comprises determining 601 an error voltage 153 by cumulating a deviation of a feedback voltage 151 from a reference voltage 152, wherein the feedback voltage 151 is indicative of (e.g. proportional to) the output voltage 150. Furthermore, the method 600 comprises generating 602 a PWM control signal 156 based on the error voltage 153. The output voltage 150 may be set (step 603) based on the PWM control signal 156.

In addition, the method 600 comprises detecting 604 a saturation situation of the system 100, during which the error voltage 153 is built up in a saturated direction without impacting the PWM control signal 156. The method 600 further comprises interrupting 605 a further build-up of the error voltage 153 in the saturated direction while allowing a modification of the error voltage 153 in an opposite direction, opposite to the saturated direction, if a saturation situation is detected.

The system 100 and method 600 described in the present document provide an efficient and reliable anti-windup protection of a PWM controlled loop. Clamping of the error voltage 156 occurs automatically, without the need for defining clamping references.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A system configured to regulate an output voltage based on a reference voltage, wherein the system comprises,
    an error amplifier configured to determine an error voltage by cumulating a deviation of a feedback voltage from the reference voltage; wherein the feedback voltage is indicative of the output voltage;
    a PWM unit configured to generate a pulse width modulated, referred to as PWM, control signal based on the error voltage and based on a PWM clock; wherein the PWM clock indicates successive cycles of the PWM control signal;
    a voltage setting unit configured to set the output voltage based on the PWM control signal;
    a saturation detection unit configured to detect a saturation situation of the system, during which the error voltage is built up in a saturated direction without impacting the PWM control signal; and
    clamping means configured to interrupt a further build-up of the error voltage in the saturated direction while allowing a modification of the error voltage in an opposite direction, opposite to the saturated direction, if the saturation situation is detected.

2. The system of claim 1, wherein
    the saturation detection unit is configured to determine a saturation signal indicating whether the saturation situation has been detected; and
    the clamping means are controlled based on the saturation signal.

3. The system of claim 1, wherein the saturation detection unit is configured to detect the saturation situation based on the PWM control signal.

4. The system of claim 3, wherein the saturation detection unit is configured to;
    determine a duration of a pulse of the PWM control signal within a cycle of the PWM control signal;
    compare the duration of the pulse with a duration of the cycle; and
    detect the saturation situation based on the comparison.

5. The system of claim 3, wherein
    the PWM control signal is used within the system to turn on or turn off a power switch of the voltage setting unit; and
    the saturation detection unit is configured to determine whether an on-time duration or an off-time duration of the power switch is at or below a pre-determined minimum duration, to detect the saturation situation.

6. The system of claim 1, wherein
    the error amplifier comprises an electrical storage unit configured to store an electrical charge;
    the error voltage increases as an amount of the electrical charge stored within the electrical storage unit increases, and the error voltage decreases as the amount of the electrical charge stored within the electrical storage unit decreases; and
    the clamping means comprise a first switch configured to stop electrical charge from being charged to the storage unit and/or a second switch configured to stop electrical charge from being discharged from the storage unit.

7. The system of claim 6, wherein
the error amplifier comprises an input stage which is configured to provide electrical charge to the storage unit or draw electrical charge from the storage unit depending on a sign of the deviation of the feedback voltage from the reference voltage; and
the first switch and/or second switch are configured to couple or to decouple the input stage to or from the storage unit.

8. The system of claim 6, wherein the storage unit comprises a capacitor.

9. The system of claim 6, wherein the clamping means are configured to
control the first switch to stop electrical charge from being charged to the storage unit and to control the second switch for enabling electrical charge from being discharged from the storage unit, if the saturation direction corresponds to an increase of the error voltage; and/or
control the first switch to enable electrical charge from being charged to the storage unit and to control the second switch for stopping electrical charge from being discharged from the storage unit, if the saturation direction corresponds to a decrease of the error voltage.

10. The system of claim 6, wherein
the error amplifier is configured to provide or to draw a quiescent electrical charge;
the clamping means are configured to
compensate the quiescent electrical charge drawn by the error amplifier, if the first switch stops electrical charge from being charged to the storage unit; and/or
compensate the quiescent electrical charge provided by the error amplifier, if the second switch stops electrical energy from being discharged from the storage unit.

11. The system of claim 1, wherein the voltage setting unit comprises a power switch which is configured to couple the output voltage to an input voltage of the system; wherein a duty cycle of the power switch depends on the PWM control signal.

12. The system of claim 1, wherein the voltage setting unit comprises a switched mode power converter which is controlled using the PWM control signal.

13. The system of claim 1, wherein
the PWM unit comprises a comparator configured to compare the error voltage with a saw wave voltage to generate the PWM control signal; and
the saw wave voltage ramps up repeatedly in a sequence of cycles set by the PWM clock.

14. The system of claim 1, wherein
the deviation of the feedback voltage from the reference voltage may be positive or negative; and
the error voltage is determined by cumulating the deviation over time without resetting the error voltage.

15. A method for setting an output voltage, wherein the method comprises the steps of:
determining an error voltage by cumulating a deviation of a feedback voltage from a reference voltage with an error amplifier; wherein the feedback voltage is indicative of the output voltage;
generating a pulse width modulated, referred to as PWM, control signal based on the error voltage with a PWM unit;
setting the output voltage based on the PWM control signal with a voltage setting unit;
detecting with a saturation detection unit a saturation situation of the system during which the error voltage is built up in a saturated direction without impacting the PWM control signal; and
interrupting, with a clamping means, a further build-up of the error voltage in the saturated direction while allowing a modification of the error voltage in an opposite direction, opposite to the saturated direction, if the saturation situation is detected.

16. The method of claim 15, wherein
a saturation detection unit determines a saturation signal indicating whether the saturation situation has been detected; and
clamping means are controlled based on the saturation signal.

17. The method of claim 16, wherein the saturation detection unit detects the saturation situation based on the PWM control signal.

18. The method of claim 17, further comprising the steps of:
determining a duration of a pulse of the PWM control signal within a cycle of the PWM control signal by the saturation detection unit;
comparing the duration of the pulse with a duration of the cycle by the saturation detection unit; and
detecting the saturation situation based on the comparison by the saturation detection unit.

19. The method of claim 17, wherein
the PWM control signal is used within the system to turn on or turn off a power switch of the voltage setting unit; and
the saturation detection unit determines whether an on-time duration or an off-time duration of the power switch is at or below a pre-determined minimum duration, to detect the saturation situation.

20. The method of claim 15, wherein
the error amplifier comprises an electrical storage unit to store an electrical charge;
the error voltage increases as an amount of the electrical charge stored within the electrical storage unit increases, and the error voltage decreases as the amount of the electrical charge stored within the electrical storage unit decreases; and
the clamping means comprise a first switch to stop electrical charge from being charged to the storage unit and/or a second switch to stop electrical charge from being discharged from the storage unit.

21. The method of claim 20, wherein
the error amplifier comprises an input stage which is to provide electrical charge to the storage unit or draw electrical charge from the storage unit depending on a sign of the deviation of the feedback voltage from the reference voltage; and
the first switch and/or second switch couple or decouple the input stage to or from the storage unit.

* * * * *